(12) United States Patent
Cohen (10) Patent No.: US 6,714,078 B1
(45) Date of Patent: Mar. 30, 2004

(54) SENSOR STRUCTURES AND METHODS FOR REDUCTION OF DIFFERENTIAL-HEATING SIGNAL ERRORS IN INTEGRATED CIRCUITS

(75) Inventor: Stephen A. Cohen, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/083,752

(22) Filed: Feb. 25, 2002

(51) Int. Cl.[7] .................................................. H03F 3/45
(52) U.S. Cl. ...................................................... 330/256
(58) Field of Search .......................... 330/85, 256, 259, 330/260, 289, 2, 261

(56) References Cited

U.S. PATENT DOCUMENTS

| | | |
|---|---|---|
| 5,424,510 A | 6/1995 | Gusinov et al. |
| 5,627,495 A | 5/1997 | Halbert et al. |
| 6,121,798 A | 9/2000 | McQuilkin |
| 6,246,353 B1 | 6/2001 | Elliott et al. |
| 6,288,604 B1 * | 9/2001 | Shih et al. .............. 330/256 X |
| 6,317,001 B1 | 11/2001 | Roth |

* cited by examiner

Primary Examiner—Steven J. Mottola
(74) Attorney, Agent, or Firm—Koppel, Jacobs, Patrick & Heybl (57) ABSTRACT

Correction sensors and methods are provided for reduction of differential-heating signal errors along a differential signal path of an electronic circuit. An exemplary correction sensor includes first and second transistors which are coupled to different sides of the differential signal path and a differential error amplifier that couples a differential correction signal to the differential signal path in differential response to a differential error signal generated by like terminals of the first and second transistors. Bias generators are preferably included to bias at least one set of same terminals of the first and second transistors that differ from the like terminals.

33 Claims, 7 Drawing Sheets

SENSOR STRUCTURES AND METHODS FOR REDUCTION OF DIFFERENTIAL-HEATING SIGNAL ERRORS IN INTEGRATED CIRCUITS

BACKGROUND OF THE INVENTION

1. Field of the Invention

The present invention relates generally to integrated circuits and, more particularly, to thermally-induced signal errors in integrated circuits.

2. Description of the Related Art

Figure 1:
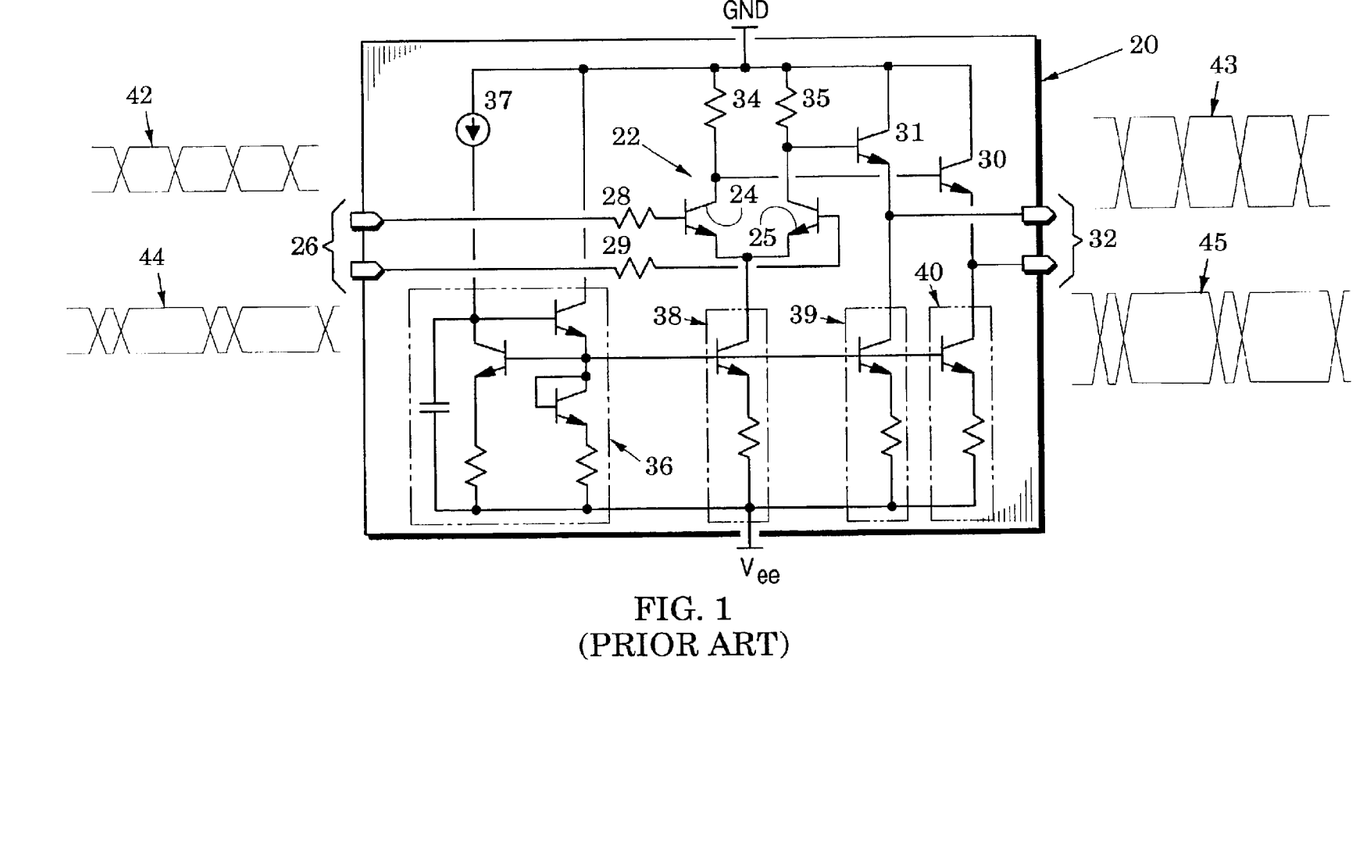
FIG. 1 is a block diagram of a conventional integrated-circuit amplifier.

An exemplary integrated circuit differential amplifier 20 is shown in FIG. 1. The amplifier 20 has a differential pair 22 of transistors 24 and 25 whose bases are coupled to a differential input port 26 by resistors 28 and 29. Buffers 30 and 31 in the form of emitter-follower transistors couple collectors of the differential pair to an output port 32 and resistors 34 and 35 couple the collectors to a first voltage bias (e.g., ground). An exemplary bias generator in the form of a current source 36 (and its associated current source 37) is coupled between the first bias source and a second bias source (e.g., $V_{ee}$) and provides a stabilized current which is respectively mirrored by current mirrors 38, 39 and 40 to the differential pair 22 and the buffers 30 and 31.

In its operation, it is intended that the amplifier 20 of FIG. 1 generates an output stream 43 of 50% duty-cycle pulses at the output port 32 in response to an input stream 42 of 50% duty-cycle pulses (for drawing clarity, the input pulse rise times are greatly exagerrated). As also indicated in FIG. 1, it is intended that the amplifier generates an output stream of pulses 45 at the output port whose duty cycle corresponds to that of an input stream 44 of pulses whose duty cycle differs from 50%.

It is often observed, however, that the fidelity of the output pulses degrades as the pulse-stream duty cycle departs from 50%. Examples of this observed signal degradation include:

a) the output duty cycle differs from the input duty cycle, b) the output stream has an offset voltage and/or a time delay which is a function of duty cycle, b) the output amplitude varies as a function of duty cycle; and c) the output amplitude varies over time (i.e., droops or rises in waveforms that are often described as "thermal tails").

This transfer-function degradation is highly undesirable as it generally produces processing errors in a variety of integrated circuits.

BRIEF SUMMARY OF THE INVENTION

The present invention is directed to reduction of differential-heating signal errors along differential signal paths of electronic circuits.

These goals are realized with a correction sensor that includes first and second transistors which are coupled to different sides of the differential signal path and a differential error amplifier that couples a differential correction signal to the differential signal path in differential response to a differential error signal generated by like terminals of the first and second transistors. In embodiments of the invention, the first and second transistors are directly connected to the different sides.

The novel features of the invention are set forth with particularity in the appended claims. The invention will be best understood from the following description when read in conjunction with the accompanying drawings.

DETAILED DESCRIPTION OF THE INVENTION

The invention is directed to correction of signal errors along a differential signal path. Feedback embodiments of the invention are described below with reference to FIGS. 1–4 and feedforward embodiments of the invention are described with reference to FIG. 5. In general, these embodiments couple first and second transistors to the differential signal path to generate a differential correction signal which is then coupled back to the differential signal path. More particularly, the first and second transistors are coupled to one of upstream and downstream portions of the differential signal path and the differential correction signal is coupled to the other of the upstream and downstream portions.

Initially, the invention observes amplifier 20 of FIG. 1 and notes that when the input stream 42 has a 50% duty cycle, the current of the current mirror 38 will be steered through differential pair transistor 24 for 50% of the total time of the input stream 42 and also steered through differential pair transistor 25 for 50% of the total time. Accordingly, transistors 24 and 25 will be substantially equally heated by power dissipation (collector current $I_c$ x collector-emitter voltage $V_{ce}$).

In contrast, the current of the current mirror 38 will be steered through a first transistor of the differential pair 22 for a greater percentage of the total time of an input stream 44 which has a duty cycle that substantially departs from 50%. Conversely, the current will be steered through a second transistor of the differential pair for a lesser percentage of the total time of the input stream. The invention notes, therefore, that the first transistor will be heated to a higher temperature than that of the second transistor, i.e., differential heating will occur in the differential pair 22.

The invention further notes that the buffer transistors 30 and 31 carry equal currents (from current mirrors 39 and 40) but the $V_{ce}$ (and, hence, power dissipation $I_c \times V_{ce}$) is greater for the buffer whose corresponding differential-pair transistor is turned on. Thus, one of the buffer transistors 30 and 31 will be heated to a higher temperature than the other during duty cycles that substantially depart from 50%., i.e., differential heating will occur in the buffer transistors 30 and 31.

Because the observed signal degradations are associated with duty cycles that depart from 50%, because these same duty cycles induce differential heating in amplifier transistors and because a number of transistor parameters (e.g., current gain β) are a function of temperature, the invention recognizes that differential heating is a significant cause of the observed transfer-function signal degradation.

In response to this recognition, the invention couples first and second transistors to a downstream signal path so that these transistors experience a similar differential heating and thereby generate a differential error signal which can be coupled to an upstream signal path for substantially reducing signal error between the upstream and downstream signal paths. The teachings of the invention can be applied to any electronic circuit which provides a transfer function between an upstream differential signal path and a downstream differential signal path.

Figure 2:
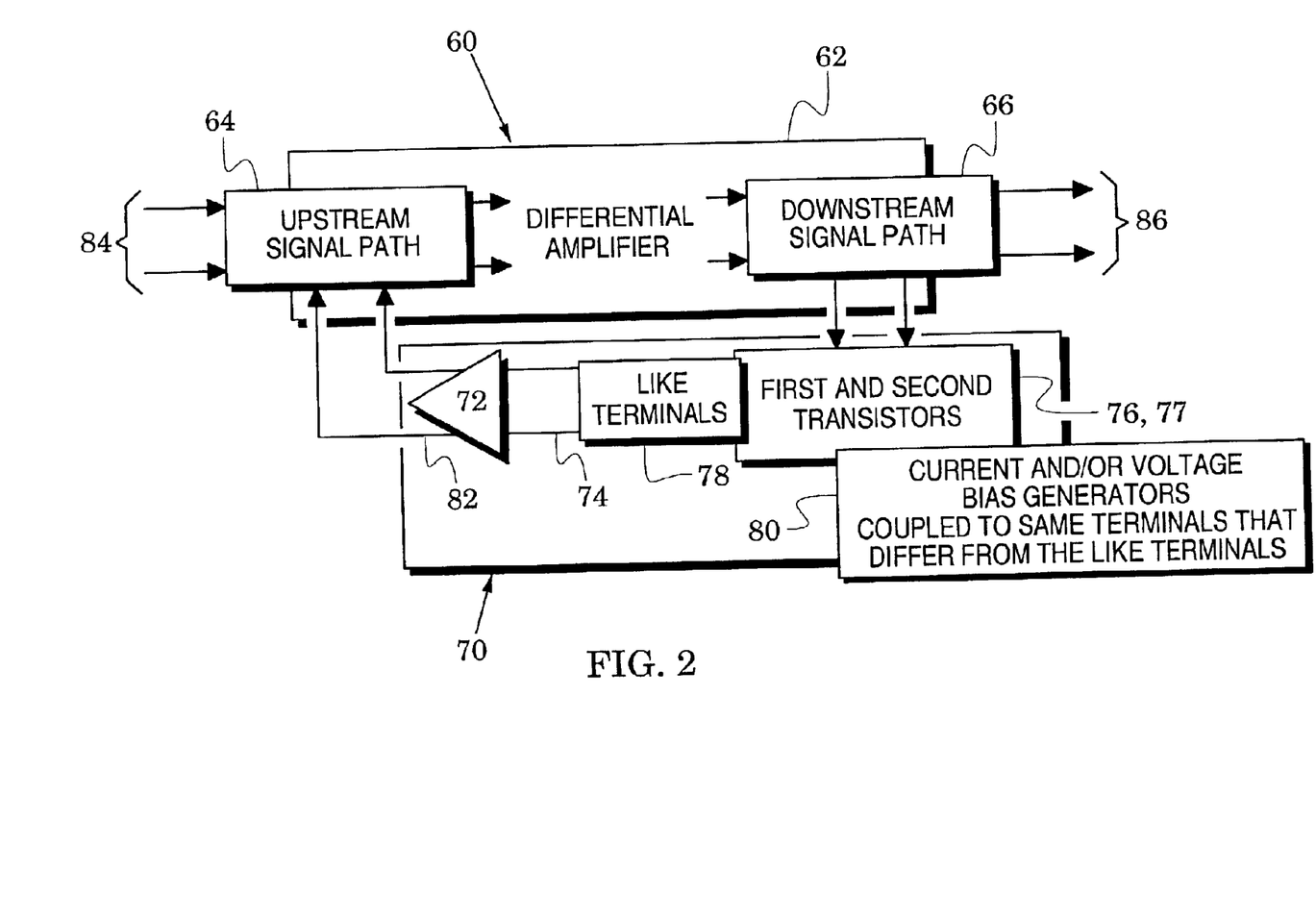
FIG. 2 is a block diagram of a a feedback embodiment of the present invention.

An exemplary electronic circuit is the differential amplifier 62 of FIG. 2 which provides differential gain between an upstream differential signal path 64 and a downstream differential signal path 66. In FIG. 2, a correction sensor 70 has a differential error amplifier 72 that responds to a differential error signal 74 from first and second transistors 76 and 77 that are coupled to different sides of the downstream differential signal path 66.

Specifically, the input to the differential error amplifier 72 is coupled to like terminals 78 of the first and second transistors. Preferably, a bias generator 80 is coupled to at least one set of same terminals of the first and second transistors 76 and 77 that differ from the like terminals 78. As described below in greater detail, this arrangement generates, at the like terminals 78, the differential error signal 74 which is a function of differential heating in the differential signal path.

This error signal can therefore, be applied as a differential correction signal 82 to reduce differential-heating signal errors along the differential signal path of the differential amplifier 62. The correction sensor 70 and the differential amplifier 62 thus form an improved amplifier 60 which has reduced errors as it processes an input differential signal 84 in the upstream signal path 64 into an output differential signal 86 in the downstream signal path 66.

In a subsequently-described amplifier embodiment of the invention, the first and second transistors 104 and 105 are bipolar junction transistors, the like terminals are emitters, same terminals of one set are collectors and their respective bias generator is at least one current source, and same terminals of another set are bases and their respective bias generator is a voltage source.

Figure 3:
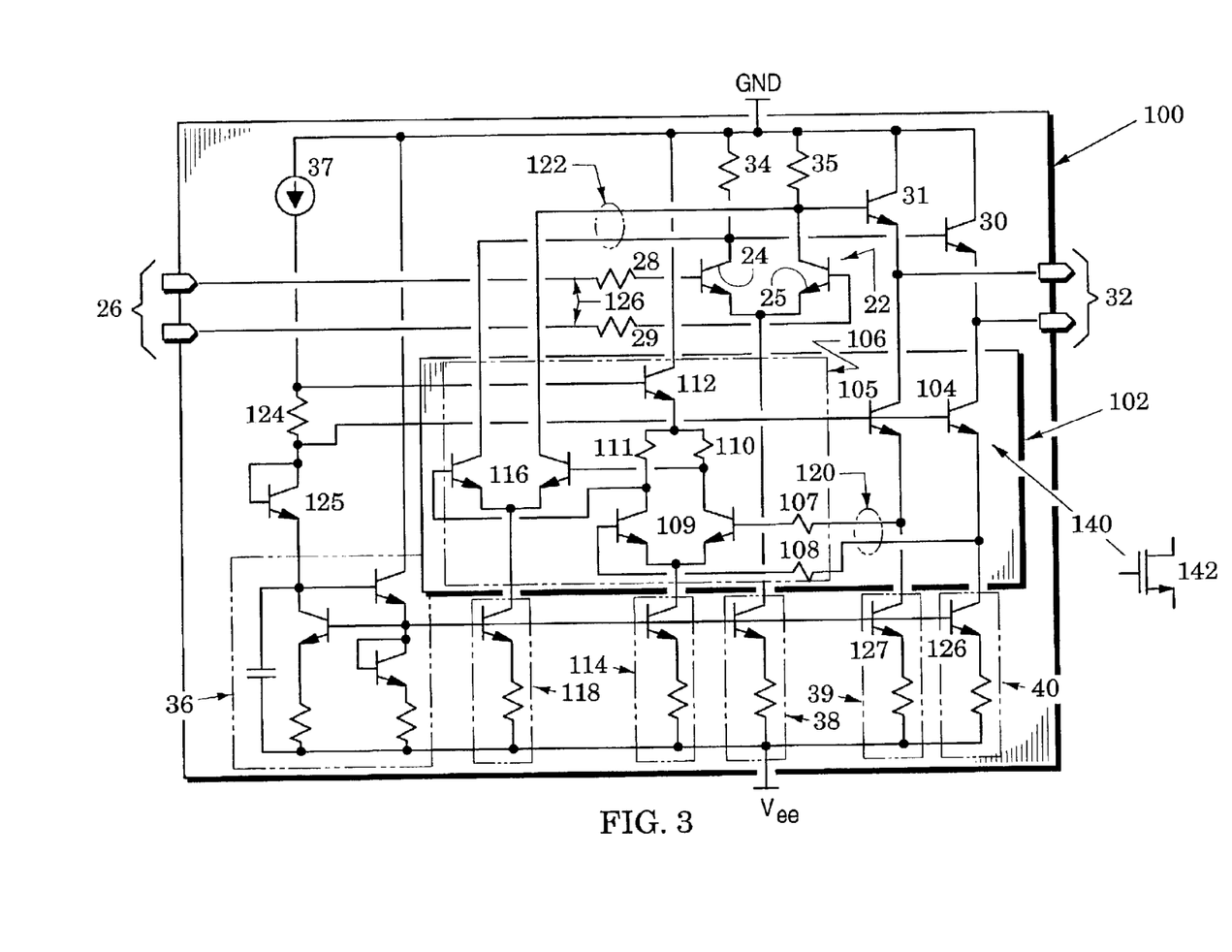
FIG. 3 is a circuit diagram of another feedback embodiment of the present invention.

Understanding of the invention is further enhanced by an investigation of the amplifier embodiment 100 of FIG. 3 which includes elements of the amplifier 20 of FIG. 1 with like elements indicated by like reference numbers. In addition, the amplifier 100 has a correction sensor 102 that includes first and second transistors 104 and 105 and a differential error amplifier 106.

Collectors of the first and second transistors 104 and 105 are coupled to a differential downstream signal path in the form of the output terminals of the buffers 30 and 31. In this embodiment, the like terminals are the emitters of the first and second transistors 104 and 105, and these like terminals are coupled through isolation resistors 107 and 108 to a first differential pair 109 of transistors which have load resistors 110 and 111 coupled to GND via a supply transistor 112. Emitters of the differential pair 109 are coupled to a current mirror 114 that is biased by the current source 36.

Collectors of the first differential pair 109 drive bases of a second differential pair 116 whose emitters are coupled to another current mirror 118 and whose collectors are differentially coupled to an upstream differential signal path in the form of the collectors of the differential pair 22. The differential pairs 109 and 116 form an embodiment 106 of the differential error amplifier 72 of FIG. 2.

In operation, the like terminals (emitters) of the first and second transistors 104 and 105 generate a differential error signal 120 which is amplified in the differential pair 109 and further amplified in the differential pair 116 into a differential current which is applied as a differential correction signal 122 (across collectors of the differential pair 22) to the upstream differential signal path.

Current mirrors 39 and 40 essentially mirror current of the current source 36 to same terminals in the form of the collectors of the first and second transistors 104 and 105. A resistor 124 and a diode-connected transistor 125 are serially inserted between the current source 36 and its associated current source 37 to thereby provide a voltage bias to same terminals in the form of the bases of the first and second transistors.

In this embodiment of the correction sensor (102 in FIG. 3), therefore, the like terminals are the emitters of the first and second transistors 104 and 105, one set of same terminals are the collectors which are current biased by the current mirrors 39 and 40, and another set of same terminals are the bases which are voltage biased by the voltage source comprised of the resistor 124 and the diode-connected transistor 125.

The base-emitter voltage $V_{be}$ of the first and second transistors may be expressed as $$V_{be} = \frac{kT}{q}\ln\frac{I_c}{I_s} = T\left[\frac{k}{q}\ln\frac{I_c}{I_s}\right] \tag{1}$$

in which k is Boltzmann's constant, q is electron charge, T is Kelvin temperature, $I_c$ is collector current and $I_s$ is a transfer-characteristic constant that has a significant temperature coefficient. Because of this temperature coefficient, the term T and the fact that the collector currents are maintained constant by the current mirrors 39 and 40, equation (1) shows that the base-emitter voltages $V_{be}$ of the first and second transistors 104 and 105 are a function of transistor temperature.

Differential heating arises in the first and second transistors 104 and 105 of FIG. 3 because the collector-base voltage ($V_{cb}$) across them has low and high states whose duty cycle is that of the duty cycle of the pulse stream through the amplifier 100. Changes of the duty cycle of the low and high states away from 50% generates more heating in one transistor than in the other. Because the bases are held at a fixed bias, the emitters of the first and second transistors therefore generate a differential error signal 120 that varies directly with the differential heating of the first and second transistors.

Variations in the, duty cycle of an input differential signal (at the differential input port 26) are a significant source of differential-heating signal errors between the differential input and output ports of FIG. 2. Because the same variations generate differential heating in the first and second transistors 104 and 105, the differential error signal 120 is a measure of these variations and can therefore be applied to the upstream signal path to reduce various differential-heating signal errors (e.g., output-voltage variations at the collectors of the buffers 30 and 31, switching-point errors in the differential pair 22, propagation delays, pulse-width errors and and thermal-tail errors along the signal path).

In operation of the differential error amplifier 106 of FIG. 3, for example, the current of the current mirror 118 is adjusted (by selection of its respective resistor) to cause the differential correction signal 122 to just cancel the differential-heating signal errors along the differential it signal path of the amplifier 100.

Different embodiments of the invention can couple the differential correction signal to various other portions of the upstream differential signal path. For example, another amplifier embodiment is formed by coupling the differential correction signal 122 in FIG. 3 to the upstream sides 126 of the base resistors 28 and 29.

Figure 4:
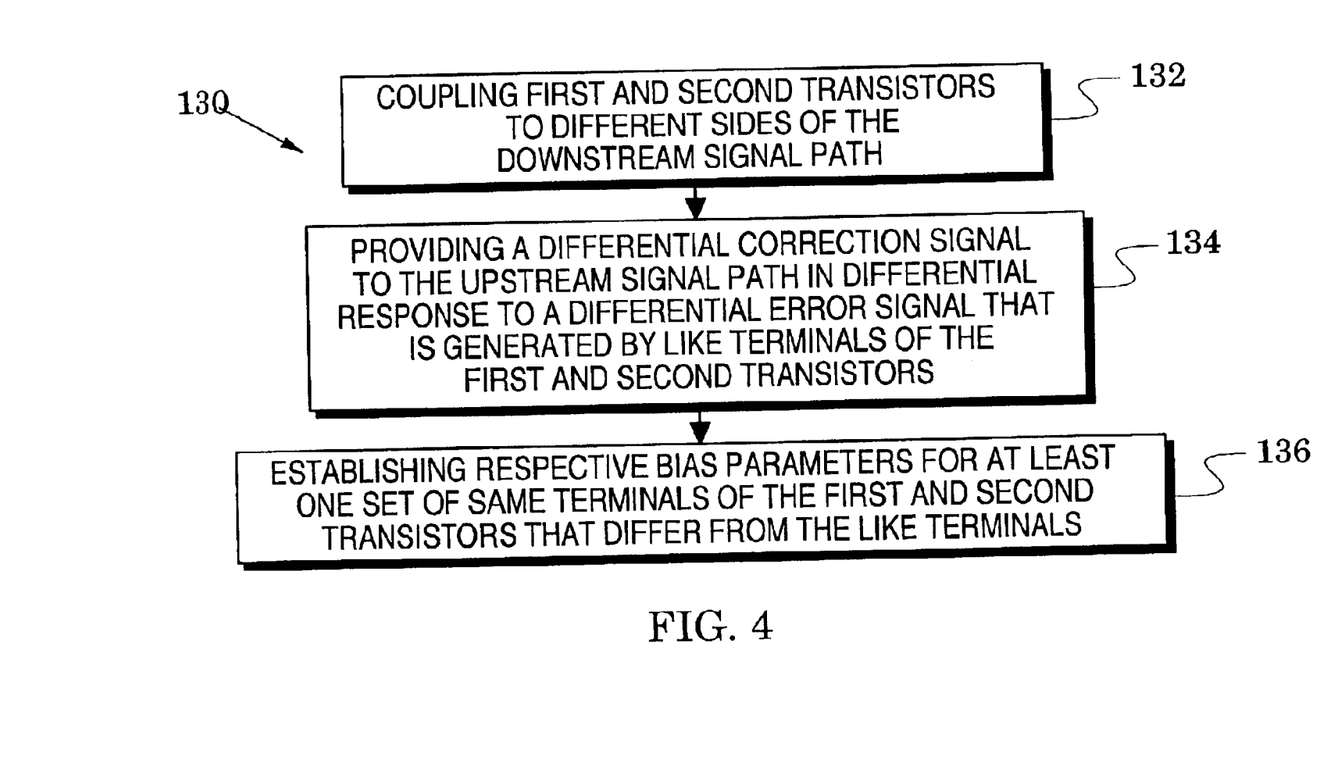
FIG. 4 is a flow chart that recites processes associated with the embodiments of FIGS. 2 and 3.

Basic processes of amplifier embodiments of the invention are summarized in the flow chart 130 of FIG. 4. These processes form a method of reducing differential-heating signal errors between an upstream differential signal path and a downstream differential signal path. In a first process 132, first and second transistors are coupled to different sides of a downstream differential signal path. A differential correction signal is provided in process step 134 to the upstream signal path in differential response to a differential error signal generated by like terminals of the first and second transistors. In process step 136, respective bias parameters are preferably established for at least one set of same terminals of the first and second transistors that differ from the like terminals.

Figure 5:
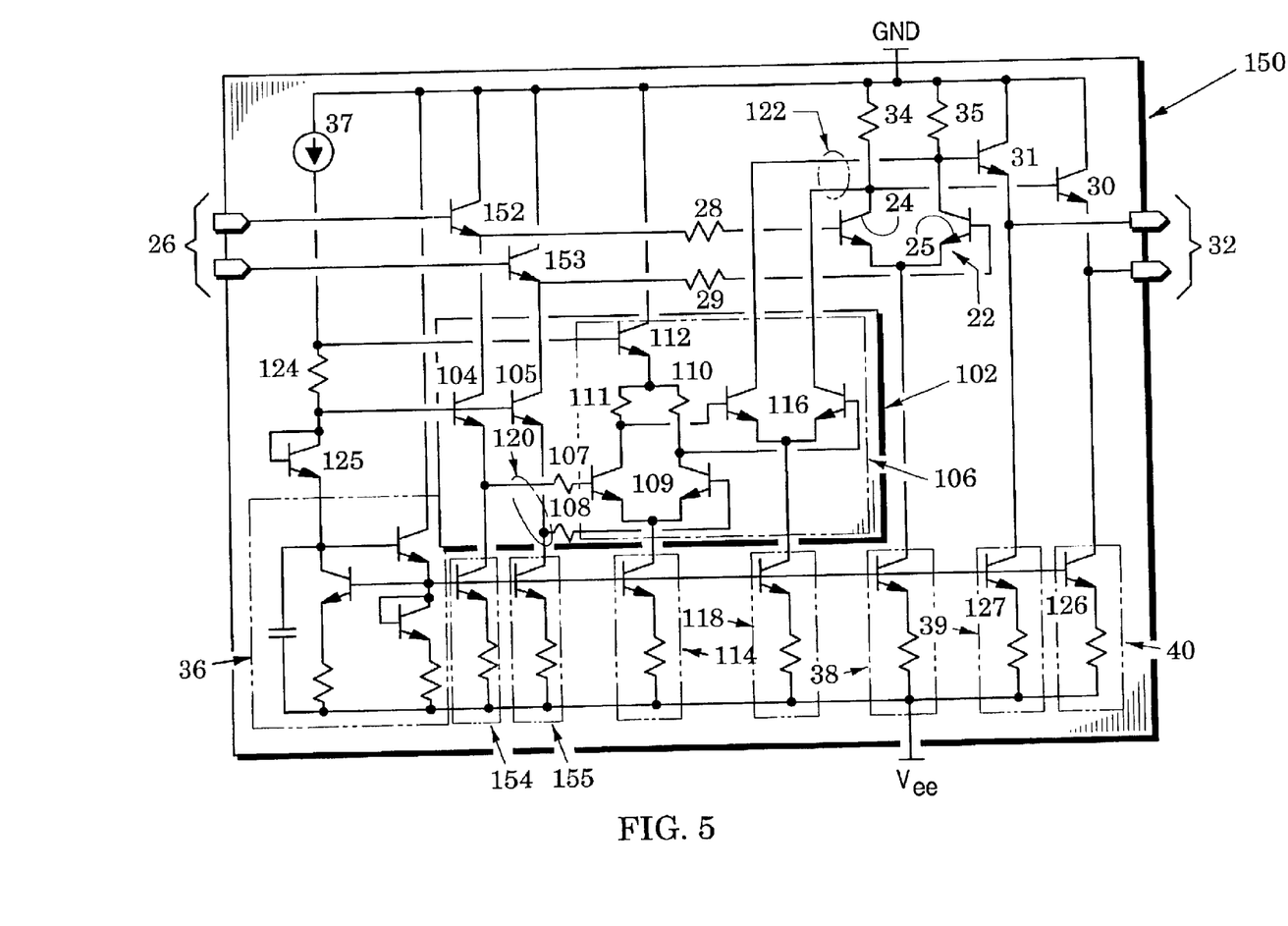
FIG. 5 is a circuit diagram of a feedforward embodiment of the present invention.

FIG. 5 illustrates a feedforward amplifier embodiment 150 which includes elements of FIG. 3 with like elements indicated by like reference numbers. In addition the amplifier 150 inserts buffers 152 and 153 (in the form of emitter-follower transistors) between the differential input port 26 and differential input terminals of the differential pair 22. Currents in the buffers 152 and 153 are established by respective current mirrors 154 and 155.

In the amplifier 150, the first and second transistors 104 and 105 of the correction sensor 102 are inserted between the current mirrors 154 and 155 and the buffers 152 and 153. They are thus coupled to different lid sides of a first portion (an upstream portion) of the differential signal path of the amplifier 150.

Collectors of the second differential pair 116 (of the differential error amplifier 106) are differentially coupled to the input buffer terminals of the buffers 30 and 31. The differential correction signal 122 is thus differentially coupled to a second portion (a downstream portion) of the differential signal path of the amplifier 150. The amplitude and phase of the differential correction signal can be appropriately adjusted to correct the signal error (e.g., by adjusting the current of the current mirror 118 and by interchanging the coupling of the collectors of the differential pair 116 to the input buffer terminals).

In the process 132 of FIG. 4, first and second transistors (104 and 105 in FIG. 3) are coupled to different sides of a downstream differential signal path. That this coupling need not be a direct connection, as it is in FIG. 3, is emphasized by the amplifier embodiment 156 of FIG. 6 which includes elements of the amplifier embodiment 100 of FIG. 3 with like elements indicated by like reference numbers (for simplicity of illustration, some upstream elements of FIG. 3 are repeated).

Figure 6:
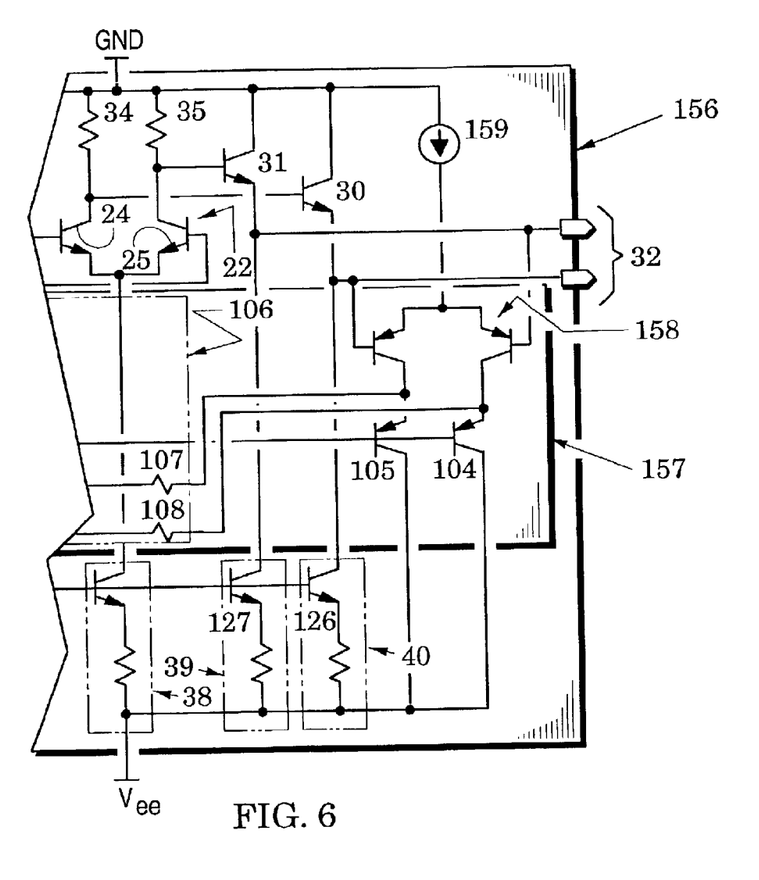
FIG. 6 is a circuit diagram of of another feedback embodiment of the present invention.

In the embodiment 156, the correction sensor 102 of FIG. 3 is modified to a correction sensor 157 by insertion of a differential pair 158 of transistors which receives a current from a current source 159. The differential pair 158 is inserted to couple the first and second transistors 104 and 105 to the differential downstream signal path that extends from the buffers 30 and 31 to the differential output port 32.

In particular, bases of the differential pair 158 are coupled across the differential downstream signal path so that the current of the current source 159 is steered between emitters of the first and second transistors 104 and 105 in response to the signal on the differential downstream signal path. Accordingly, the first and second transistors generate a differential error signal and couple this signal to the isolation resistors 107 and 108.

In this embodiment of the correction sensor (157 in FIG. 6), the like terminals (in process step 134 of FIG. 4) are the emitters of the first and second transistors 104 and 105 and one set of same terminals (in process step 136 of FIG. 4) are the bases which are voltage biased by the voltage source comprised of the resistor 124 and the diode-connected transistor 125 of FIG. 3.

It is noted that the base-emitter voltages $V_{be}$ of the first and second transistors 104 and 105 vary in response to differential heating of these transistors and this variation forms the desired differential error signal. It is further noted, however, that the base-emitter voltages $V_{be}$ will be significantly altered in FIG. 6 as the current of the current source 159 is steered between the first and second transistors.

In order to lessen the distorting effect of this alteration on the differential error signal, a duplicate set of the first and second transistors 104 and 105, differential pair 158 and current source 159 is preferably provided in addition to the original set shown in FIG. 6. In the duplicate set, the bias voltage on the bases of the first and second transistors is substantially reduced so that the voltage across the transistors is substantially reduced and the differential-heating signal variation is also substantially reduced. Thus, the differential signal across the emitters of the duplicate set is essentially only that due to the current steering effect. This differential signal may now be subtracted from that of the original set which substantially removes the distorting effect from the differential error signal.

Figure 7:
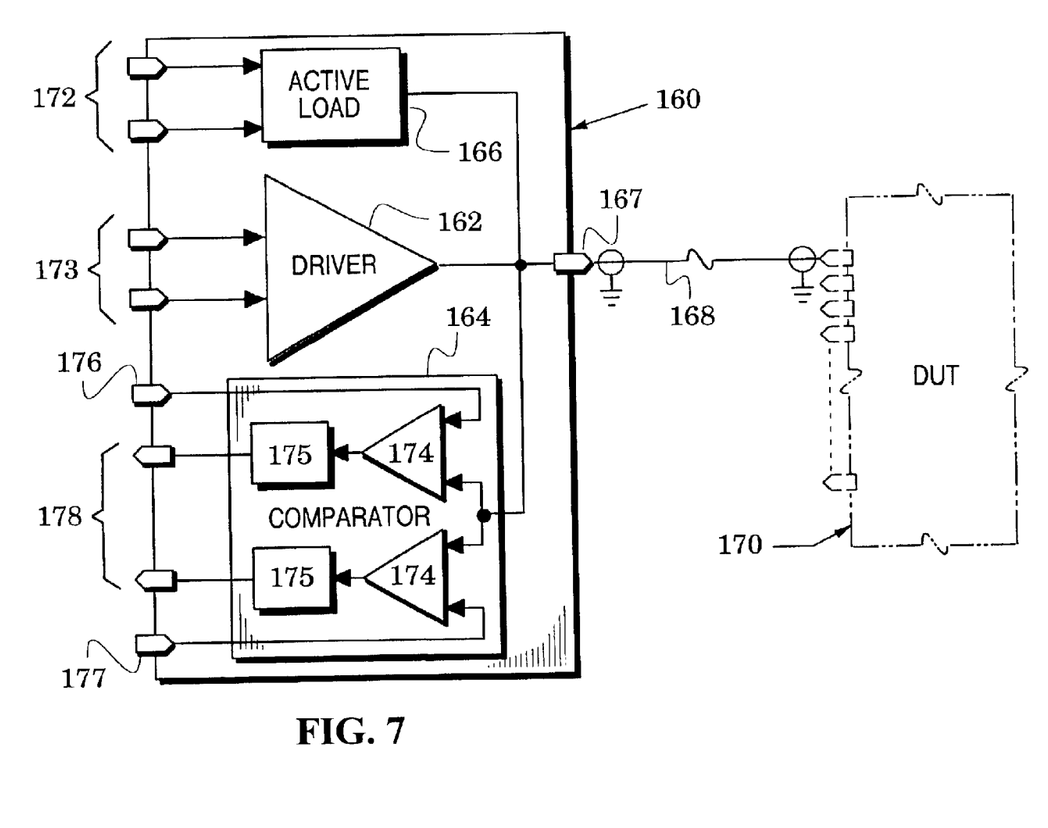
FIG. 7 is a block diagram of a pin electronics system in accordance with the present invention.

FIG. 7 illustrates a pin electronics system 160 that provides a pin driver 162, a comparator 164 and a programmable active load 166 which can all be coupled through a system port 167 and a coupling transmission line 168 to facilitate testing of a device-under-test (DUT) 170.

An exemplary DUT might be specified to source a source current $I_s$ while delivering a response voltage $V_{rspn}$ in response to an excitation signal $S_{xctn}$. In response to differential commands 172 and 173, the active load 166 and the driver 162 are thus configured to respectively receive the source current Is and generate the excitation signal $S_{xctn}$ The comparator 164 is typically a window comparator 174 with associated latches 175 which compares a DUT signal at the system port 167 to predetermined reference signals at reference ports 176 and 177. Accordingly, the comparator output at comparator port 178 is a measure of whether the DUT was able to provide its specified output voltage $V_{out}$ and source current $I_s$.

Because it includes a pin driver, a comparator and an active load, the pin electronics system is also often referred to as a driver/comparator/load (DCL) module. Differential pairs of transistors similar to the differential pair 22 of FIG. 3 are used in a variety of structures (e.g., the pin driver 162 and the comparator 164) of the pin electronics system 160 of FIG. 7 and the duty cycles of command signals (e.g., differential commands 172 and 173) to these differential pairs vary over a wide range. Accordingly, the pin electronics system 160 preferably includes sensor structures of the present invention (e.g., the correction sensor 102 of FIG. 3) that will reduce differential-heating signal errors which are induced by the varying duty cycles of the system.

The invention is directed to signal errors along differential signal paths. In particular, the invention enhances the fidelity of ratios of signal-path output signals (e.g., current, voltage and power) to signal-path input signals (e.g., current, voltage and power). Although the teachings of the invention can reduce a variety of signal errors (e.g., duty cycle, phase and gain errors), it is particularly effective in the reduction of offset errors.

It is noted that the first and second transistors of the invention (e.g., 104 and 105 of FIG. 3) generate a differential signal in response to differential heating but not in response to absolute heating. The differential error signal (120 in FIG. 3) is thus a measure of differential heating but is substantially unaffected by variations in the ambient temperature.

Although embodiments of the invention have been described above with reference to bipolar junction transistors, other embodiments can be formed with other transistor types. In metal-oxide semiconductor transistors, for example, the gate-source voltage is also a function of temperature. The teachings of the invention can thus be practiced with metal-oxide semiconductor transistors. This is indicated in FIG. 3 by an exemplary substitution (indicated by substitution arrow 140) of a metal-oxide semiconductor transistor 142 for the first bipolar junction transistor 104.

In another amplifier embodiment, therefore, the first and second transistors 104 and 105 are metal-oxide semiconductor transistors, the like terminals are sources, same terminals of one set are drains and their respective bias generator is at least one current source, and same terminals of another set are gates and their respective bias generator is a voltage source. In a different amplifier embodiment the first and second transistors 104 and 105 are bipolar junction transistors and the like terminals are bases. In yet another another amplifier embodiment, the first and second transistors 104 and 105 are metal-oxide semiconductor transistors and the like terminals are gates.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of reducing differential-heating signal errors along a differential signal path, the method comprising the steps of:

coupling first and second transistors to different sides of said differential signal path; and providing a differential correction signal to said differential signal path in differential response to a differential error signal generated by like terminals of said first and second transistors;

further including the step of establishing respective bias parameters for at least one set of same terminals of said first and second transistors that differ from said like terminals;

wherein said first and second transistors are bipolar junction transistors, said like terminals are emitters, same terminals of one set are collectors and their respective bias parameter is current, and same terminals of another set are bases and their respective bias parameter is voltage.

2. A method of reducing differential-heating signal errors along a differential signal path, the method comprising the steps of:

coupling first and second transistors to different sides of said differential signal path; and providing a differential correction signal to said differential signal path in differential response to a differential error signal generated by like terminals of said first and second transistors;

further including the step of establishing respective bias parameters for at least one set of same terminals of said first and second transistors that differ from said like terminals;

wherein said first and second transistors are metal-oxide semiconductor transistors, said like terminals are sources, same terminals of one set are drains and their respective bias parameter is current, and same terminals of another set are gates and their respective bias parameter is voltage.

3. The method of claim 1, wherein said providing step includes the step of amplifying said differential error signal to realize said differential correction signal.

4. The method of claim 1, wherein said differential correction signal is a differential current signal.

5. The method of claim 1, wherein said first and second transistors are coupled to one of upstream and downstream portions of said differential signal path and said differential correction signal is provided to the other of said upstream and downstream portions.

6. The method of claim 1, wherein said coupling step includes the step of directly connecting said first and second transistors to said different sides of said differential signal path.

7. A correction sensor for reduction of differential-heating signal errors along a differential signal path the sensor comprising:

first and second transistors coupled to different sides of said differential signal path; and a differential error amplifier that couples a differential correction signal to said differential signal path in differential response to a differential error signal generated by like terminals of said first and second transistors;

further including a bias generator which biases at least one set of same terminals of said first and second transistors that differ from said like terminals:

wherein:

said first and second transistors are bipolar junction transistors and said like terminals are emitters;

same terminals of one set are collectors and a respective bias generator is at least one current source; and same terminals of another set are bases and a respective bias generator is a voltage source.

8. The sensor of claim 7, further including a bias generator which biases at least one set of same terminals of said first and second transistors that differ from said like terminals.

9. A correction sensor for reduction of differential-heating signal errors along a differential signal path of the sensor comprising:

first and second transistors coupled to different sides of said differential signal path; and a differential error amplifier that couples a differential correction signal to said differential signal path in differential response to a differential error signal generated by like terminals of said first and second transistors;

further including a bias generator which biases at least one set of same terminals of said first and second transistors that differ from said like terminals;

wherein:

said first and second transistors are metal-oxide semiconductor transistors and said like terminals are sources;

same terminals of one set are drains and a respective bias generator is at least one current source; and same terminals of another set are gates and a respective bias generator is a voltage source.

10. The sensor of claim 7, wherein said differential error amplifier includes a differential pair of transistors and said differential correction signal is a differential current.

11. The sensor of claim 7, wherein said first and second transistors are coupled to one of upstream and downstream portions of said differential signal path and said differential correction signal is coupled to the other of said upstream and downstream portions.

12. The sensor of claim 7, wherein said first and second transistors are directly connected to said different sides of said differential signal path.

13. An amplifier of comprising:

a differential amplifier that processes a differential signal along a differential signal path; and a correction sensor that has first and second transistors coupled to different sides of said differential signal path and a differential error amplifier that couples a differential correction signal to said differential signal path in differential response to a differential error signal generated by like terminals of said first and second transistors;

wherein said first and second transistors are bipolar junction transistors and said like terminals are emitters of said bipolar junction transistors;

differential-heating signal errors of said differential amplifier thereby reduced by said sensor.

14. The amplifier of claim 13, further including a bias generator that establishes respective bias parameters for at least one set of same terminals of said first and second transistors that differ from said like terminals.

15. The amplifier of claim 14, wherein said bias generator comprises first and second current sources that couple first and second currents through said first and second transistors.

16. An amplifier, comprising:

a differential amplifier that processes a differential signal along a differential signal path; and a correction sensor that has first and second transistors coupled to different sides of said differential signal path and a differential error amplifier that couples a differential correction signal to said differential signal path in differential response to a differential error signal generated by like terminals of said first and second transistors;

wherein said first and second transistors are metal-oxide semiconductor transistors and said like terminals are sources of said metal-oxide semiconductor transistors;

differential-heating signal errors of said differential amplifier thereby reduced by said sensor.

17. The amplifier of claim 13, wherein:

said differential amplifier includes a differential pair of transistors and first and second buffers that have buffer output terminals and also have buffer input terminals coupled to differential output terminals of said differential pair;

said first and second transistors are coupled to said buffer output terminals; and said correction sensor is coupled to said buffer input terminals.

18. The amplifier of claim 13, wherein:

said differential amplifier includes a differential pair of transistors and first and second buffers that have buffer output terminals and also have buffer input terminals coupled to differential output terminals of said differential pair;

said first and second transistors are coupled to said buffer output terminals; and said correction sensor is coupled to differential input terminals of said differential amplifier.

19. The amplifier of claim 13, wherein:

said differential amplifier includes a differential pair of transistors and first and second buffers that have buffer output terminals and also have buffer input terminals coupled to differential output terminals of said differential pair;

said first and second transistors are coupled to said differential input terminals of said differential amplifier; and said correction sensor is coupled to differential output terminals of said differential amplifier.

20. The amplifier of claim 13, wherein said first and second transistors are coupled to one of upstream and downstream portions of said differential signal path and said differential correction signal is coupled to the other of said upstream and downstream portions.

21. The amplifier of claim 13, wherein said first and second transistors are directly connected to said different sides of said differential signal path.

22. A pin electronics system for testing of a device-under-test (DUT) at a DUT system port, comprising:

a pin driver that applies an excitation signal to said system port;

an active load that provides a load to said system port; and a comparator coupled to said system port to compare a response signal of said DUT to a predetermined reference signal;

wherein at least one of said pin driver, active load and comparator includes:

a) a differential pair of transistors positioned to process a differential signal along a differential signal path;

b) first and second transistors coupled to different sides of said differential signal path; and c) a differential error amplifier that couples a differential correction signal to said differential signal path in differential response to a differential error signal generated by like terminals of said first and second transistors;

differential-heating signal errors of said differential pair thereby reduced by said sensor.

23. The system of claim 22, further including a bias generator that establishes respective bias parameters for at least one set of same terminals of said first and second transistors that differ from said like terminals.

24. The system of claim 22, wherein said first and second transistors are bipolar junction transistors and said like terminals are emitters of said bipolar junction transistors.

25. The system of claim 22, wherein said first and second transistors are metal-oxide semiconductor transistors and said like terminals are sources of said metal-oxide semiconductor transistors.

26. The system of claim 22, wherein:

said differential amplifier includes a differential pair of transistors and first and second buffers that have buffer output terminals and also have buffer input terminals coupled to differential output terminals of said differential pair;

said first and second transistors are coupled to said buffer output terminals; and said correction sensor is coupled to said buffer input terminals.

27. The system of claim 22, wherein:

said differential amplifier includes a differential pair of transistors and first and second buffers that have buffer output terminals and also have buffer input terminals coupled to differential output terminals of said differential pair;

said first and second transistors are coupled to said buffer output terminals; and said correction sensor is coupled to differential input terminals of said differential amplifier.

28. The system of claim 22, wherein:

said differential amplifier includes a differential pair of transistors and first and second buffers that have buffer output terminals and also have buffer input terminals coupled to differential output terminals of said differential pair;

said first and second transistors are coupled to said differential input terminals of said differential amplifier; and said correction sensor is coupled to differential output terminals of said differential amplifier.

29. The system of of claim 22, wherein said first and second transistors are coupled to one of upstream and downstream portions of said differential signal path and said differential correction signal is coupled to the other of said upstream and downstream portions.

30. The amplifier of claim 22, wherein said first and second transistors are directly connected to said different sides of said differential signal path.

31. The method of claim 2, wherein said first and second transistors are coupled to one of upstream and downstream portions of said differential signal path and said differential correction signal is provided to the other of said upstream and downstream portions.

32. The sensor of claim 9, wherein said first and second transistors are coupled to one of upstream and downstream portions of said differential signal path and said differential correction signal is coupled to the other of said upstream and downstream portions.

33. The amplifier of claim 16, wherein said first and second transistors are coupled to one of upstream and downstream portions of said differential signal path and said differential correction signal is coupled to the other of said upsteam and downstream portions.

* * * * *